(12) United States Patent  
Shin

(10) Patent No.: US 8,823,145 B2  
(45) Date of Patent: Sep. 2, 2014

(54) MULTILAYER BOARD AND LIGHT-EMITTING MODULE HAVING THE SAME

(75) Inventor: Kyung Ho Shin, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 410 days.

(21) Appl. No.: 12/331,734

(22) Filed: Dec. 10, 2008

(65) Prior Publication Data

US 2009/0154513 A1 Jun. 18, 2009

(30) Foreign Application Priority Data

Dec. 12, 2007 (KR) .................... 10-2007-0129362

(51) Int. Cl.
*H01L 23/48* (2006.01)
*H01L 23/495* (2006.01)
*H01L 29/06* (2006.01)

(52) U.S. Cl.
USPC ............................ 257/625; 257/276; 257/675

(58) Field of Classification Search
USPC ......................... 257/276, 625, 675
See application file for complete search history.

(56) References Cited

U.S. PATENT DOCUMENTS

| | | | | |
|---|---|---|---|---|
| 5,640,048 A * | 6/1997 | Selna | ............................ | 257/738 |
| 5,710,459 A * | 1/1998 | Teng et al. | .................... | 257/717 |
| 6,114,413 A * | 9/2000 | Kang et al. | .................... | 523/210 |
| 6,350,957 B1 * | 2/2002 | Shingai et al. | ................ | 174/254 |
| 6,507,115 B1 * | 1/2003 | Hofstee et al. | ................ | 257/777 |
| 6,670,699 B2 * | 12/2003 | Mikubo et al. | ................ | 257/678 |
| 6,733,711 B2 * | 5/2004 | Durocher et al. | ........ | 264/272.14 |
| 6,833,566 B2 * | 12/2004 | Suehiro et al. | .................. | 257/99 |
| 6,861,750 B2 * | 3/2005 | Zhao et al. | .................... | 257/739 |
| 6,900,535 B2 * | 5/2005 | Zhou | ............................. | 257/707 |
| 7,488,622 B2 * | 2/2009 | Bogner et al. | ................ | 438/123 |
| 7,505,109 B2 * | 3/2009 | Cheng et al. | .................. | 349/161 |
| 7,550,319 B2 * | 6/2009 | Wang et al. | .................... | 438/125 |
| 7,626,211 B2 * | 12/2009 | Sugiura et al. | .................. | 257/99 |
| 7,714,341 B2 * | 5/2010 | Chil Keun et al. | ............. | 257/98 |
| 7,808,013 B2 * | 10/2010 | Mendendorp et al. | ......... | 257/99 |
| 7,821,027 B2 * | 10/2010 | Shin et al. | ..................... | 257/100 |
| 8,053,799 B2 * | 11/2011 | Kwon et al. | .................... | 257/98 |
| 2002/0038908 A1 * | 4/2002 | Ding et al. | .................... | 257/720 |
| 2002/0074668 A1 * | 6/2002 | Hofstee et al. | ................ | 257/777 |
| 2002/0163006 A1 * | 11/2002 | Yoganandan et al. | .......... | 257/81 |
| 2005/0024834 A1 * | 2/2005 | Newby | .......................... | 361/719 |

(Continued)

FOREIGN PATENT DOCUMENTS

| | | |
|---|---|---|
| JP | 5-218226 A | 8/1993 |
| JP | 2006-253205 A | 9/2006 |
| JP | 2007-67237 A | 3/2007 |
| KR | 10-2007-0042710 A | 4/2007 |

OTHER PUBLICATIONS

English machine translation of JP-2006-253205-A published Sep. 21, 2006.

(Continued)

*Primary Examiner* — James Mitchell
(74) *Attorney, Agent, or Firm* — Birch, Stewart, Kolasch & Birch, LLP

(57) ABSTRACT

Provided are a multilayer board and a light-emitting module having the same. The light-emitting module comprises a light-emitting diode chip and a multilayer board. The multilayer board is electrically connected to the light-emitting diode chip and comprises a nonconductive heat sink via and a thin copper layer.

8 Claims, 2 Drawing Sheets

(56) References Cited

U.S. PATENT DOCUMENTS

| | | |
|---|---|---|
| 2005/0045369 A1* | 3/2005 | Ishimaru et al. ............ 174/250 |
| 2005/0082561 A1* | 4/2005 | Suehiro et al. ............... 257/99 |
| 2005/0212098 A1* | 9/2005 | Bogner et al. .............. 257/666 |
| 2006/0049475 A1* | 3/2006 | Wang et al. ................. 257/432 |
| 2006/0131732 A1* | 6/2006 | Nah et al. ................... 257/706 |
| 2006/0186535 A1* | 8/2006 | Baker et al. ................. 257/720 |
| 2007/0057364 A1* | 3/2007 | Wang et al. ................. 257/701 |
| 2007/0080447 A1* | 4/2007 | Hasebe et al. ............... 257/706 |
| 2007/0085101 A1 | 4/2007 | Kim |
| 2007/0120234 A1* | 5/2007 | Kim et al. ................... 257/666 |
| 2007/0187701 A1* | 8/2007 | Goon et al. ................... 257/88 |
| 2007/0241303 A1* | 10/2007 | Zhong et al. .............. 252/62.3 T |
| 2008/0032454 A1* | 2/2008 | Romig et al. ................ 438/122 |
| 2008/0035938 A1* | 2/2008 | Mazzochette ................. 257/89 |
| 2008/0067526 A1* | 3/2008 | Chew ............................ 257/88 |
| 2008/0099770 A1* | 5/2008 | Mendendorp et al. ......... 257/79 |
| 2008/0128739 A1* | 6/2008 | Sanpei et al. ................. 257/99 |
| 2008/0296717 A1* | 12/2008 | Beroz et al. ................. 257/434 |
| 2009/0072250 A1* | 3/2009 | Inoue ............................ 257/88 |
| 2009/0146295 A1* | 6/2009 | Narita et al. ................ 257/720 |

OTHER PUBLICATIONS

English machine translation of JP-2007-67237-A published Mar. 15, 2007.

English machine translation of JP-5-218226 published Aug. 27, 1993.

* cited by examiner

MULTILAYER BOARD AND LIGHT-EMITTING MODULE HAVING THE SAME

CROSS-REFERENCE TO RELATED APPLICATIONS

The present application claims priority under 35 U.S.C. §119 to Korean Patent Application No. 10-2007-00129362 (filed on Dec. 12, 2007), which is hereby incorporated by reference in its entirety.

BACKGROUND

The present disclosure relates to a multilayer board and a light-emitting module having the same.

III-V group nitride semiconductors are widely used as optical devices such as blue/green light-emitting diodes (LEDs), high-speed switching devices such as Metal Semiconductor Field Effect Transistors (MOSFETs) and Hetero junction Field Effect Transistors (HEMTs), and light sources of illumination or display devices.

The nitride semiconductors are being widely used in LEDs or laser diodes (LDs), and continuous researches are being conducted to improve the fabrication process or the optical efficiency.

A light-emitting module having a substrate mounting a plurality of LEDs is used in various fields such as display devices. Accordingly, researches are being conducted to prevent the degradation of the optical efficiency and the electrical characteristics of LEDs mounted on the light-emitting module.

SUMMARY

Embodiments provide a multilayer board comprising a nonconductive heat sink via and a light-emitting module having the same.

Embodiments provide a multilayer board and a light-emitting module having the same, which makes it possible to use a nonconductive heat sink via of the multilayer board as a heat sink channel of an LED chip.

An embodiment provides a light-emitting module comprising: a light-emitting diode chip; and a multilayer board connected electrically to the light-emitting diode chip and comprising a nonconductive heat sink via and a thin copper layer.

An embodiment provides a light-emitting module comprising: a multilayer board comprising a first thin copper layer comprising a plurality of electrode patterns, and a nonconductive heat sink via; and a light-emitting diode chip connected electrically to the electrode patterns.

An embodiment provides a multilayer board comprising: a first thin copper layer comprising a electrode pattern in a chip-mounting region; a second thin copper layer under the first thin copper layer; a resin between the first thin copper layer and the second thin copper layer; and a nonconductive heat sink via contacts at least one of the electrode pattern and the second thin copper layer.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

In the description of embodiments, it will be understood that when a layer (or film), region, pattern or structure is referred to as being 'on' or 'under' another layer (or film), region, pad or pattern, the terminology of 'on' and 'under' comprises both the meanings of 'directly' and 'indirectly'.

Figure 1:
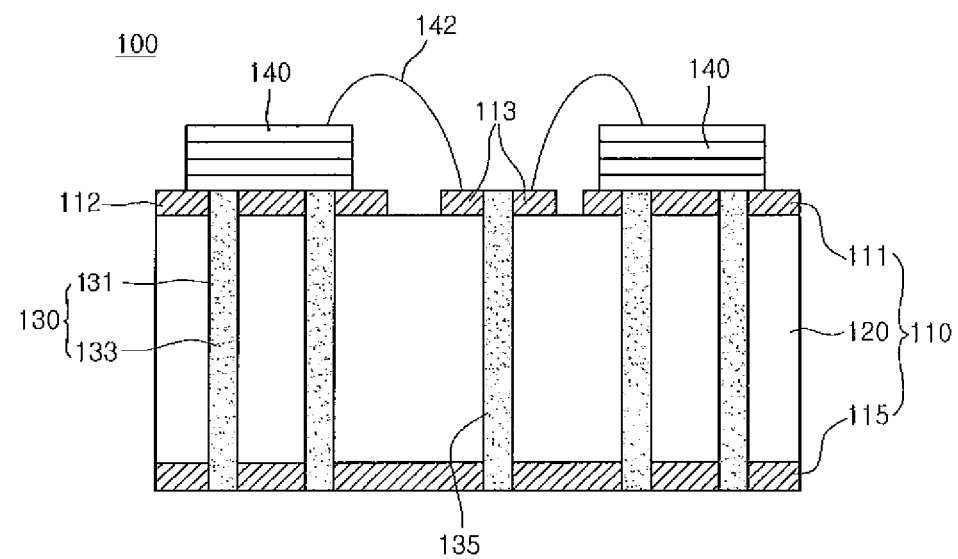
FIG. 1 is a side sectional view of a light-emitting module according to a first embodiment.

FIG. 1 is a side sectional view of a light-emitting module according to a first embodiment.

Referring to FIG. 1, a light-emitting module 100 comprises a multilayer board 110 comprising heat sink vias 130 and 135, and a light-emitting diode chip 140.

The multilayer board 110 is a printed circuit board (PCB) having a stack of a plurality of thin copper layers 111 and 115. For example, the multilayer board 110 comprises a high temperature co-fired ceramic (HTCC) or low temperature co-fired ceramic (LTCC) ceramic substrate, a silicon substrate, and a FLAME RETARDANT-4 (FR-4) substrate, to which the present invention is not limited.

The multilayer board 110 comprises a resin layer 120 forming an inside layer, a first thin copper layer 111 on the resin layer 120, and a second thin copper layer 115 under the resin layer 120.

For the first and second thin copper layers 111 and 115, a plating layer may be plated on copper through a plating process, to which the present invention is not limited.

The first thin copper layer 111 is a top side of the multilayer board 110, and is formed of a first electrode pattern 112 and a second electrode pattern 113 according to the design of a circuit pattern. The first electrode pattern 112 and the second electrode pattern 113 are open to each other.

The second thin copper layer 115 is a bottom side of the multilayer board 110, may be patterned in a predetermined circuit pattern, and may serve as a heat sink plate.

The multilayer board 110 comprises at least one or more heat sink vias 130 and 135. The heat sink vias 130 and 135 are formed in a through hole form between the first thin copper layer 111 and the second thin copper layer 115, and may be used as a heat sink channel.

The heat sink vias 130 and 135 are formed by filling a thermally conductive material 133 in a via hole 131 penetrating vertically between the first thin copper layer 111 and the second thin copper layer 115. The heat sink vias 130 and 135 have a thermally conductive feature and a nonconductive feature.

The via hole 131 of the heat sink vias 130 and 135 may be formed using a drill. The thermally conductive material 133 is a material having a nonconductive feature and conducting heat, and may be formed of a mixture of a nonconductive material and a material with a high thermal conductivity. For example, the thermally conductive material 132 may be formed of a mixture of a high polymer material and a filler with a high thermal conductivity. The polymer material comprises thermal grease or thermal paste. The filler may comprise at least one of aluminum nitride, silica, alumina, metallic silicon, boron nitride, and zinc oxide powder.

One end of the heat sink vias 130 and 135 contacts the first electrode pattern 112 and/or the second electrode pattern 113 of the first thin copper layer 111, and the other end contacts the second thin copper layer 115.

The heat sink vias 130 and 135 are nonconductive via structures, and at least one end of them may be disposed at the first electrode pattern 112 and the second electrode pattern 113.

The light-emitting diode chip 140 is a vertical-type semiconductor light-emitting device, and a first electrode and a second electrode may be formed respectively at the bottom and top thereof. The light-emitting diode chip 140 is bonded on the first electrode pattern 112 by a conductive adhesive, and is connected to the second electrode pattern 113 by a wire 142.

At least one heat sink via 130 may be disposed at the first electrode pattern 112 of a region mounting the light-emitting diode chip 140. At least one heat sink via 135 may be disposed at the second electrode pattern 113 to which the wire 142 is bonded.

A plurality of light-emitting diode chips 140 may be disposed in an array pattern on the first thin copper layer 111 of the multilayer board 110.

When power is supplied through the first electrode pattern 112 and the second electrode pattern 113, a current flows a path of the second electrode pattern 113, the light-emitting diode chip 140 and the first electrode pattern 112, so that the light-emitting diode chip 140 emits light.

Heat generated from the light-emitting diode chip 140 is transferred to the first electrode pattern 112 and the heat sink via 130. The heat sink via 130 transfers heat transferred from the first electrode pattern 112 and the light-emitting diode chip 140 to the second thin copper layer 115. The second thin copper layer 115 dissipates heat transferred through the heat sink via 130 of the first electrode pattern 112.

The heat sink via 135 of the second electrode pattern 113 transfers heat, which is generated by a current flowing through the second electrode pattern 113, to the second thin copper layer 115, and the second thin copper layer 115 dissipates heat transferred from the heat sink via 135 of the second electrode pattern 113.

The heat sink vias 130 and 135 of the multilayer board 110 provide a heat sink channel for transferring the heat of the first electrode pattern 112 and the second electrode pattern 113 to the second thin copper layer 115. Also, the heat sink vias 130 and 135 of the multilayer board 110 has no electrical characteristics, thus making it possible to prevent the problem of a closed circuit.

Also, one end of at least one heat sink via 130 contacts the light-emitting diode chip 140, so that the heat generated from the light-emitting diode chip 140 can be transferred and dissipated to the second thin copper layer 115 through the shortest channel comprising the heat sink via 130.

A lateral type LED chip may be mounted on the multilayer board 110. The lateral-type LED chip may be electrically connected to the first electrode pattern 112 and the second electrode pattern 113 by wires or by a flip-chip technique.

Figure 2:
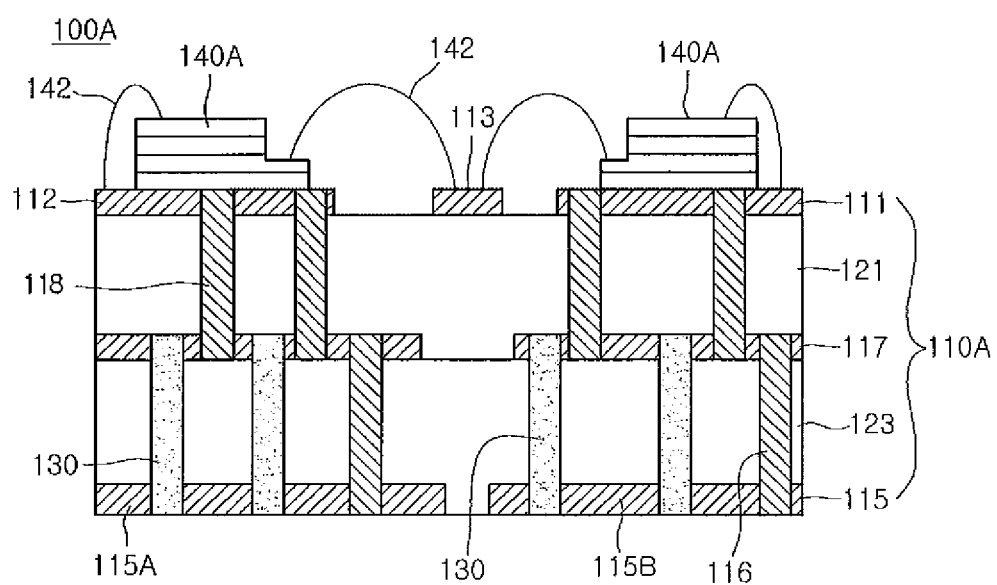
FIG. 2 is a side sectional view of a light-emitting module according to a second embodiment.

FIG. 2 is a side sectional view of a light-emitting module according to a second embodiment. In describing the second embodiment, a description of an overlap with the first embodiment will be omitted for conciseness.

Referring to FIG. 2, a light-emitting module 100A comprises a multilayer board 110A comprising a conductive via 118 and a heat sink via 130, and a light-emitting diode chip 140A.

The multilayer board 110A has a stack of three or more thin copper layers 111, 115 and 117. For example, if the multilayer board 110A has a three-layer structure, it comprises a top-side first thin copper layer 111, a bottom-side second thin copper layer 115, and at least one inside third thin copper layer 117 and resin layers 121 and 123 are formed between the thin copper layers 111, 115 and 117.

The first thin copper layer 111 comprises first and second electrode patterns 112 and 113, and the light-emitting diode chip 140A is bonded on the first electrode pattern 112 by an insulating adhesive. The insulating adhesive may comprise epoxy or silicon material.

The light-emitting diode chip 140A is connected to the first and second electrode patterns 112 and 113 by wires 142.

The light-emitting diode chip 140A is a lateral-type semiconductor light-emitting device having an electrode with a lateral structure. The light-emitting diode chip 140A may be connected to the first and second electrode patterns 112 and 113 by two wires. Herein, not the lateral-type semiconductor light-emitting device but a vertical-type semiconductor light-emitting device may be disposed at the first electrode pattern 112, to which the present invention is not limited. Also, the present invention is not limited by the number of the light-emitting diode chips 140A and the mounting technique (e.g., a flip-chip technique) of the light-emitting diode chip 140A.

The first electrode pattern 112 and the third thin copper layer 117 may be connected by the conductive via 118, and the third thin copper layer 117 and the second thin copper layer 115 may be connected by a conductive via 116 and/or the heat sink via 130.

The conductive vias 118 and 116 serve as via holes, vias, or through holes, and may be filled with a metal material having a high electrical conductivity and a high thermal conductivity, to which the present invention is not limited.

The first electrode pattern 112 and the second electrode pattern 113 may be connected to the third thin copper layer 117 by the conductive via 118 and/or the heat sink via, to which the present invention is not limited.

Heat generated from the light-emitting diode chip 140A is transferred through the first electrode pattern 112 and the conductive via 118 to the third thin copper layer 117, and the third thin copper layer 117 transfers the heat through the heat sink via 130 and the conductive via 116 to the second thin copper layer 115, thereby dissipating heat.

In other words, the conductive via 118 between the first electrode pattern 112 and the third thin copper layer 117 performs a primary thermal conduction, and the heat sink via 130 between the third thin copper layer 117 and the second thin copper layer 115 performs a secondary thermal conduction.

In the multilayer board 110A, a heat sink channel may be provided by a mixture of the conductive vias 118 and 116 and the heat sink via 130, or by only the heat sink via 130.

Also, the second thin copper layer 115 may be used as external electrodes 115A and 115B. The external electrodes 115A and 115B are connected through the first electrode pattern 112 and the conductive vias 118 and 116, so that they can be electrically connected to one second electrode of the light-emitting diode chip 140A. Also, the second electrode pattern 113, which is electrically connected to another electrode of the light-emitting diode chip 140A, may be electrically connected to a partial pattern (not shown) of the second thin copper layer 115, to which the present invention is not limited.

The multilayer board 110A selectively disposes the heat sink via 130 in a multilayer structure, thereby making it possible to effectively dissipate the heat generated by the light-emitting diode chip. Also, the light-emitting diode chip may have a free circuit design regardless of the position of the heat sink via 130.

In embodiments, a resin material or lens may be formed around the light-emitting diode chip, to which the present invention is not limited.

Although the embodiment has illustrated a module structure for the multilayer board mounting the light-emitting diode chip, it can effectively dissipate heat even when other chip components (e.g., memories and IC chips) are mounted on the multilayer board with the heat sink via.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light-emitting module comprising:
    a board comprising:
        metal layers including a first metal layer formed on an upper surface of the board, a second metal layer formed on a bottom surface of the board, and a third metal layer interposed between the first metal layer and the second metal layer;
        a resin layer between the first or second layer and the third metal layer;
        a first via connected between the first metal layer and the third metal layer; and
        a second via connected between the second metal layer and the third metal layer;
    a light-emitting diode chip disposed on the first metal layer;
    a wire electrically connected between the first metal layer and the light-emitting diode chip; and
    a heat sink via mechanically connected between the second metal layer and the third metal layer,
    wherein the first via is laterally offset from the second via,
    wherein at least one of the metal layers functions as a heat sink, and
    wherein the heat sink via comprises an electrically insulating material.

2. The light-emitting module according to claim 1, wherein at least one of the first and second vias is formed by filling a thermally conductive material.

3. The light-emitting module according to claim 2, wherein the thermally conductive material is formed of a mixture of a nonconductive material.

4. The light-emitting module according to claim 1, wherein the metal layers are formed of copper.

5. The light-emitting module according to claim 1, wherein the resin layer is a ceramic material.

6. The light-emitting module according to claim 1, wherein a bottom surface of the first metal layer is higher than a top surface of the third metal layer.

7. The light-emitting module according to claim 1, wherein the second via comprises a second thermally conductive feature and an electrically conductive feature.

8. The light-emitting module according to claim 1, wherein at least one portion of the heat sink via is not vertically overlapped with the light-emitting diode chip.

* * * * *